United States Patent [19]
Ohdate

[11] Patent Number: 4,829,364
[45] Date of Patent: May 9, 1989

[54] SEMICONDUCTOR DEVICE

[75] Inventor: Mituo Ohdate, Fukuoka, Japan

[73] Assignee: Mitsubishi Denki Kabushiki Kaisha, Tokyo, Japan

[21] Appl. No.: 933,389

[22] Filed: Nov. 21, 1986

[30] Foreign Application Priority Data

Nov. 29, 1985 [JP] Japan ............................. 60-270387
Nov. 29, 1985 [JP] Japan ............................. 60-270388

[51] Int. Cl.$^4$ ................... H01L 23/28; H01L 23/02; H01L 23/32
[52] U.S. Cl. ............................. 357/72; 357/74; 357/76
[58] Field of Search ................... 357/72, 74, 76

[56] References Cited

U.S. PATENT DOCUMENTS

| | | | |
|---|---|---|---|
| 2,438,893 | 4/1948 | Bieling | 357/74 |
| 2,560,579 | 7/1951 | Kock et al. | 357/74 |
| 2,825,015 | 2/1958 | Stineman et al. | 357/74 |
| 3,986,201 | 10/1976 | Herold et al. | 357/72 |
| 4,099,201 | 7/1978 | Mueller | 357/72 |
| 4,150,394 | 4/1979 | Sugawa et al. | 357/72 |
| 4,188,637 | 2/1980 | Gerstenkoper et al. | 357/72 |
| 4,399,452 | 8/1983 | Nakashima et al. | 357/72 |
| 4,646,131 | 2/1987 | Amagasa et al. | 357/74 |

Primary Examiner—Andrew J. James
Assistant Examiner—Gregory A. Key
Attorney, Agent, or Firm—Saidman, Sterne, Kessler & Goldstein

[57] ABSTRACT

In a semicondur device comprising a semiconductor element, a pair of electrodes provided on the opposite sides of the semiconductor element, and a cylindrical member provided to surround the semiconductor element and to be in engagement with the pair of electrodes, each of the electrodes has a thread portion on its outer periphery, and the cylindrical member has a thread portion on its inner periheral surface screwed onto each of the thread portions of the electrodes, thereby to provide a hermetic seal for the semiconductor element.

20 Claims, 2 Drawing Sheets

SEMICONDUCTOR DEVICE

BACKGROUND OF THE INVENTION

The present invention relates to a semiconductor device, and more particularly to an improvement on the hermetic seal of a semiconductor element.

Generally, a power semiconductor element is contained or encapsulated in a vessel such as a ceramic seal, a glass seal or the like. This is because the electrical characteristics of the PN junction are easily affected by the atmosphere.

In a conventional high-power semiconductor device, metal electrodes are provided on both sides of a semiconductor element, ends of an insulating cylinder of ceramics, glass or the like is disposed to surround or be wrapped around the semiconductor element and the metal electrodes and ends of the insulator cylinder are brazed to the peripheries of the electrodes by metal flanges to obtain hermetic seal. But, the semiconductor device formed as described above is expensive because the hermeticallysealing vessel is costly.

One consideration to be made in connection with the desired hermetic seal is that in recent years glass films are formed at the PN junction of a semiconductor element and the stability of the electrical characteristics against the atmosphere have been improved. As a result, the requirement on the hermetic seal has been alleviated. An example of simplified vessel which is formed of less expensive materials and can be easily assembled is shown in FIG. 1.

The semiconductor device shown in FIG. 1 comprises a semiconductor element 1 comprising a silicon wafer having a PN junction and molybdenum disks brazed on both sides of the silicon wafer. A cathode electrode 2 and an anode electrode 3 are formed of copper and plated with nickel, and are provided on both sides of the semiconductor element 1. The electrodes 2 and 3 have flanges 2a and 3a, which are provided with dents 2b and 3b. A sealing ring 4 formed of a resilient insulator has grooves 4a on its inner periphery, and the flanges 2a and 3a are fitted in the grooves 4a. Thus, the device is so assembled that the insulating ring 4 is disposed to surround the semiconductor element 1. Radiator fins, not shown, are thereafter pressed on the electrodes 2 and 3 to achieve contact between the radiator fins and the electrodes 2 and 3, and between the electrodes 2 and 3 and the semiconductor element, thereby to obtain thermal and electrical connection. The hermetic seal is obtained between the flanges 2a and 3a of the electrodes 2 and 3, and the grooves 4a of the resilient sealing ring 4.

With the above-described semiconductor device, the hermetic seal is achieved only when the radiator fins are mounted. If the period until the radiator fins are mounted is long, the molybdenum electrodes of the semiconductor element 1 may be corroded by the moisture in the atmosphere, so that the contact resistances with the electrodes 2 and 3 are increased and the electrical and the thermal characteristics are degraded. To prevent the corrosion, gold may be plated or gold foils may be cladded on the molybdenum electrodes of the semiconductor element 1. Use of gold or gold foils however increases the cost of the device. If the gold or gold foils are not used, the semiconductor device cannot be stored for a long time, and the process control is difficult. Moreover, the device is subject to undesirable disintegration by accidental application of a small impact, which makes the handling of the device inconvenient. Thus, there is a restriction in this respect on the users of the semiconductor device.

SUMMARY OF THE INVENTION

An object of the invention is to provide a semiconductor device which is hermetically sealed even before the radiator fins are mounted.

According to the invention, there is provided a semiconductor device comprising a semiconductor element, a pair of electrodes provided on the opposite sides of the semiconductor element, and a cylindrical member provided to surround the semiconductor element and to be in engagement with the pair of electrodes, each of the electrodes having a thread portion on its outer periphery, and the cylindrical member having a thread portion on its inner peripheral surface screwed onto each of the thread portions of the electrodes, thereby to provide a hermetic seal for the semiconductor element.

With the above described arrangement, the cylindrical member acting as a sealing ring are screwed with the pair of electrodes, so that a good hermetic seal is obtained. Moreover, the device can be easily assembled, and the device is less costly.

DETAILED DESCRIPTION OF THE PREFERRED EMBODIMENTS

Figure 1:
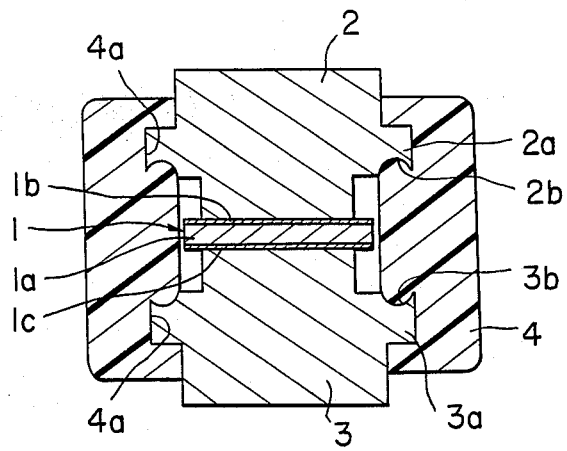
FIG. 1 is a longitudinal sectional view showing a conventional semiconductor device.
Figure 2:
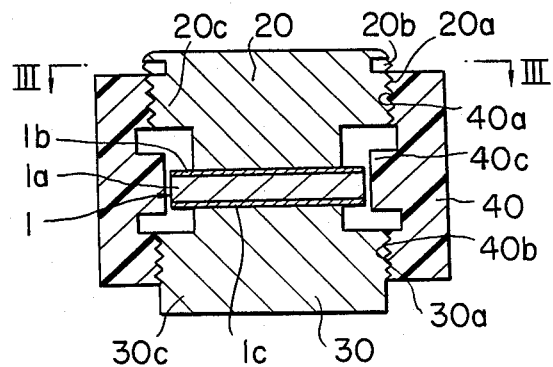
FIG. 2 is a longitudinal sectional view showing a semiconductor device of an embodiment of the invention.
Figure 3:
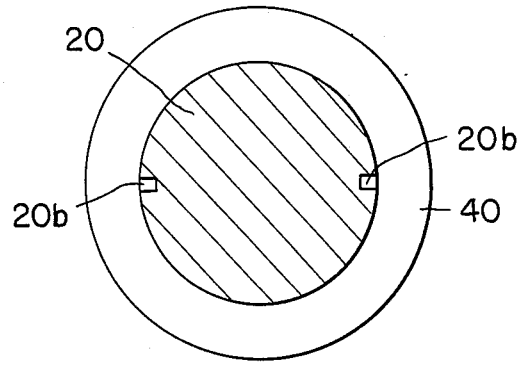
FIG. 3 is a cross sectional view along the line III—III in FIG. 2.

As is illustrated in FIG. 2, a semiconductor device of an embodiment of the invention comprises a semiconductor element 1 comprising a silicon wafer 1a in the form of a flat-type diode having a PN junction and a molybdenum disks 1b, 1c, brazed on the respective sides or surfaces of the silicon wafer 1a. A cathode electrode 20 and an anode electrode 30 are formed of copper and plated with nickel and are provided on the respective sides or surfaces of the semiconductor element 1. In other words, the semiconductor element 1 is placed between the electrodes 20 and 30. The cathode electrode 20 is provdied on its outer periphery a thread portion 20a. Similarly, the anode electrode 30 is provided on its outer periphery a thread portion 30a.

In the embodiment illustrated, the cathode electrode 20 has a flange portion 20c extending radially outward, and the anode electrode 30 has a flange portion 30c extending radially outward, and the thread portions 20a and 30a are provided on the outer peripheries of the respective electrodes 20 and 30.

The cathode electrode 20 is also provided with a pair of holes or pits provided on the opposite points and extending radially toward the axis of the disk-shaped electrode 20.

An insulating cylindrical member 40 is provided to surround the semiconductor element 1 and the electrodes 20 and 30 is provided with a first thread portion 40a on the upper (as viewed in FIG. 2) end of the inner peripheral surface of the cylindrical member 40 and a second thread position 40b on the lower (as viewed in FIG. 2) end of the inner peripheral surface of the cylindrical member 40. The first thread portion 40a is used to screw the cathode electrode 20 into the cylindrical member 40. The second thread portion 40b is used to screw the anode electrode 30 into the cylindrical member 40.

The pits 20b of the cathode electrode 20 are used for engagement with a pair of pin-shaped members of a tool, not shown, for screwing the cylindrical member 40 and the electrode 20. The cylindrical member 40 is formed of a plastic material preferrably having an elongation rate of 2 to 10 percent, and serves as a sealing ring.

The cylindrical member 40 is further provided with an inner flange portion 40c extending radially inward to place the semiconductor element 1 in position.

To assemble the semiconductor device, the anode electrode 30 is screwed into the cylindrical member 40. Then, the semiconductor element 1 is placed on the anode electrode 30. Subsequently, the cathode electrode 20 is screwed into the cylindrical member 40. During the screwing of the cathode electrode 20 into the cylindrical member 40, pins of a screwing tool, not shown, are inserted in the pits 20b of the cathode electrode 20, so that the thread portions 20a, 30a of the electrodes 20, 30 and the thread portions 40a, 40b of the cylindrical members are tightly screwed, with a predetermined torque, with each other to provide a good hermetic seal.

To obtain a snug fit between the thread portions, and thereby to provide a good hermetic seal, the cylindrical member should preferably have an elongation rate of 2 to 10 percent. When the elongation rate is smaller, the thread portion may be broken before a sufficient contact pressure and hence a sufficient hermetic seal is obtained. When the elongation rate is larger the cylindrical member is so easily deformed that the desired contact pressure and hence a sufficient degree of hermetic seal cannot be obtained.

In the embodiment described, the semiconductor element 1 is a flat type diode. But the invention is applicable to any other semiconductor element.

The embodiment described above has the following advantages.

(i) The device can be easily assembled, and a good hermetic seal is maintained. The device is not accidentally and undesirably disintegrated.

(ii) It is not necessary to use a rare metal such as gold to prevent corrosion of the semiconductor element. The cost of the semiconductor element is therefore substantially reduced.

(iii) The restrictions on the period of storage and the manner of handling the semiconductor device after the assembly have been eliminated. Thus, the device is more convenient for the users.

Figure 4:
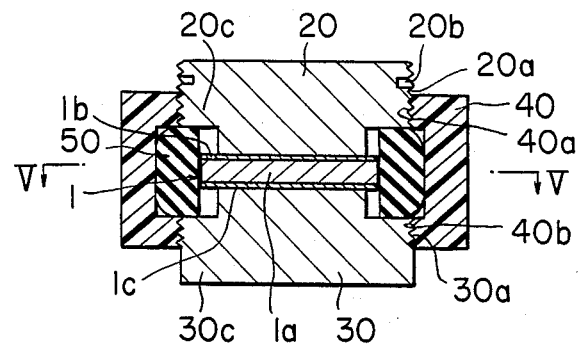
FIG. 4 is a longitudinal sectional view showing a second embodiment of the invention.

A second embodiment of the semiconductor device according to the invention as illustrated in FIG. 4 is basically identical to the embodiment of FIG. 2, but has the following additional features. That is, there is further provided a resilient annular member 50 formed of a silicone rubber and surrounding or wrapped around the semiconductor element 1. More particularly, the inner flange portion 40c has been eliminated, and the resilient annular member 50 extend along a space between the outer periphery of the semiconductor element 1 and the inner periphery of the middle part of the cylindrical member 40 and the lower surface of the flange portion 20c of the cathode electrode 20 and the upper surface of the flange portion 30c of the anode electrode 30. The resilient annular member 50 is in contact with the outer periphery of the semiconductor element 1 to properly position the semiconductor element 1. The cathode electrode 20 is screwed in the cylindrically member 40 at a certain tightening torque, so that the resilient annular member 50 is compressed between the flange portions 20c and 30c. Because of the additional pressed contact between the flange portions 20a and 30a and the resilient annular member 50, the hermetic seal of the semiconductor element 1 from the atmosphere is further improved.

The dimensions of the resilient annular member 50 may be selected considering the deformation due to compression by the electrodes 20 and 30.

Figure 5:
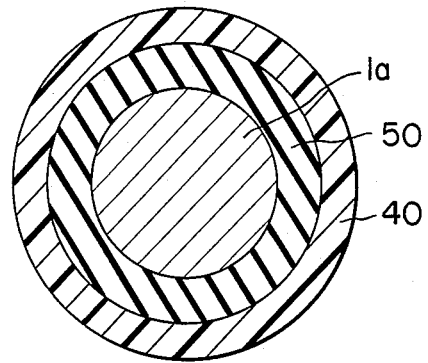
FIG. 5 is a cross sectional view along the line V—V in FIG. 4.

The embodiment of FIGS. 4 and 5 has the following additional advantage:

(iv) The resilient annular member 50 is compressed between the flange portions 20c and 30c, so that the hermetic seal of the semiconductor element 1 is further improved.

What is claimed is:

1. A semiconductor device comprising
   a semiconductor element,
   a pair of electrodes provided on the opposite sides of the semiconductor element, and
   a cylindrical member provided to surround the semiconductor element and to be in engagement with the pair of electrodes,
   each of the electrodes having a thread portion on its outer periphery, and
   the cylindrical member having a thread portion on its inner peripheral surface screwed onto each of the thread portions of the electrodes, thereby to provide a hermetic seal for the semiconductor element.

2. A device according to claim 1, wherein the cylindrical member is an insulating member.

3. A device according to claim 2, wherein the cylindrical member is formed of a plastic material having an elongation rate within the range of 2 to 10 percent.

4. A device according to claim 1, wherein the thread portions of the cylindrical member are formed at both ends of the cylindrical member.

5. A device according to claim 1, wherein the thread portion of one of the electrodes has at least two pits for engagement with pins or protrusions of a tool used for screwing said one of the electrodes and the cylindrical member with each other.

6. A device according to claim 1, further comprising a resilient annular member surrounding the semiconductor element, wherein each of the electrodes has a flange portion and the resilient annular member is compressed between the flange portions of the electrodes.

7. A device according to claim 6, wherein the thread portion on each of the electrodes are provided on the outer periphery of the flange portion.

8. A device according to claim 6, wherein the resilient annular member is formed of silicone rubber.

9. An electronic device comprising:

a semiconductor element;

first and second electrodes on opposite sides of said semiconnector element; and a cylindrical body which substantially surrounds said semiconductor element and is in a hermetically sealed engagement with said first and said second electrodes;

wherein at least one of said electrodes comprises a threaded portion, said threaded portion of said electrode mating with a threaded portion of said cylindrical body to effect a hermetic seal.

10. The device of claim 9, wherein said body is formed of a polymer material having an elongation within the range of 2 to 10%.

11. A device according to claim 1, wherein said semiconductor element comprises a silicon wafer having molybdenum disks on two surfaces thereof.

12. A device according to claim 1, wherein said first and second electrodes are provided on opposite surfaces of said semiconductor element.

13. A device according to claim 1, wherein said semiconductor element is placed between said first and second electrodes.

14. A device according to claim 1, wherein exposed surfaces of said semiconductor element are not covered with gold.

15. A device according to claim 6, wherein said semiconductor element comprises a silicon wafer having molybdenum disks on two surfaces thereof.

16. A device according to claim 6, wherein said first and second electrodes are provided on opposite surfaces of said semiconductor element.

17. A device according to claim 6, wherein said semiconductor element is placed between said first and second electrodes.

18. A device according to claim 9, wherein said semiconductor element comprises a silicon wafer having molybdenum disks on two surfaces thereof.

19. An electronic device comprising:

a semiconductor element;

a cathode electrode and an anode electrode connected to opposite surfaces of said semiconductor element, said semiconductor element being placed between said anode and cathode electrodes;

a substantially cylindrical body, which includes at least one threaded portion on an inner surface thereof, and which substantially surrounds said semiconductor element; and a resilient annular member, which surrounds said semiconductor element within said cylindrical body;

wherein each of said electrodes comprises a threaded portion, which mates with said threaded portion of said cylindrical body to effect a hermetic seal therebetween.

20. A device according to claim 19, wherein said resilient annular member is in contact with the periphery of said semiconductor element.

* * * * *